(12) United States Patent
Sun (10) Patent No.: US 12,439,579 B2
(45) Date of Patent: Oct. 7, 2025

(54) STATIC RANDOM ACCESS MEMORY AND METHOD FOR FABRICATING THE SAME

(71) Applicant: UNITED MICROELECTRONICS CORP., Hsin-Chu (TW)

(72) Inventor: Chia-Chen Sun, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 412 days.

(21) Appl. No.: 18/123,992

(22) Filed: Mar. 21, 2023

(65) Prior Publication Data
US 2024/0284651 A1 Aug. 22, 2024

(30) Foreign Application Priority Data
Feb. 21, 2023 (CN) .......................... 202310142379.9

(51) Int. Cl.
*H10B 10/00* (2023.01)
(52) U.S. Cl.
CPC .................................... *H10B 10/12* (2023.02)
(58) Field of Classification Search
CPC ......... H10B 10/12; H10D 30/62; H10D 89/10
See application file for complete search history.

(56) References Cited

U.S. PATENT DOCUMENTS

| | | | |
|---|---|---|---|
| 8,942,030 B2 | 1/2015 | Liaw | |
| 10,515,954 B2 * | 12/2019 | Liaw | H10D 84/0158 |
| 11,037,937 B2 * | 6/2021 | Zhao | H10D 84/0158 |
| 11,315,933 B2 * | 4/2022 | Wen | H10D 84/853 |

OTHER PUBLICATIONS

Huang, the specification, including the claims, and drawings in the U.S. Appl. No. 18/071,658, filed Nov. 30, 2022.

\* cited by examiner

*Primary Examiner* — Allison Bernstein
(74) *Attorney, Agent, or Firm* — Winston Hsu (57) ABSTRACT

A method for fabricating a static random access memory (SRAM) includes the steps of forming a first fin-shaped structure for a first pull-down (PD) transistor on a substrate, forming a second fin-shaped structure for a second PD transistor on the substrate, forming a third fin-shaped structure for a first pass gate (PG) transistor on the substrate, and forming a fourth fin-shaped structure for a second PG transistor on the substrate. Preferably, the first fin-shaped structure and the second fin-shaped structure include a first recess therebetween and the third fin-shaped structure and the fourth fin-shaped structure include no recess therebetween.

17 Claims, 6 Drawing Sheets

STATIC RANDOM ACCESS MEMORY AND METHOD FOR FABRICATING THE SAME

BACKGROUND OF THE INVENTION

1. Field of the Invention

The invention relates to a method for fabricating static random access memory (SRAM), and more particularly to a method of forming trenches between part of fin-shaped structures while not forming trenches between part of the trenches.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer system as a cache memory.

However, as pitch of the exposure process decreases, it has been difficult for current SRAM architecture to produce desirable patterns. Hence, how to enhance the current SRAM architecture for improving exposure quality has become an important task in this field.

SUMMARY OF THE INVENTION

According to an embodiment of the present invention, a method for fabricating a static random access memory (SRAM) includes the steps of forming a first fin-shaped structure for a first pull-down (PD) transistor on a substrate, forming a second fin-shaped structure for a second PD transistor on the substrate, forming a third fin-shaped structure for a first pass gate (PG) transistor on the substrate, and forming a fourth fin-shaped structure for a second PG transistor on the substrate. Preferably, the first fin-shaped structure and the second fin-shaped structure include a first recess therebetween and the third fin-shaped structure and the fourth fin-shaped structure include no recess therebetween.

According to another aspect of the present invention, a static random access memory (SRAM) includes a first fin-shaped structure for a first pull-down (PD) transistor on a substrate, a second fin-shaped structure for a second PD transistor on the substrate as the first fin-shaped structure and the second fin-shaped structure have a first recess therebetween, a third fin-shaped structure for a first pass gate (PG) transistor on the substrate, and a fourth fin-shaped structure for a second PG transistor on the substrate as the third fin-shaped structure and the fourth fin-shaped structure have no recess therebetween.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved. Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
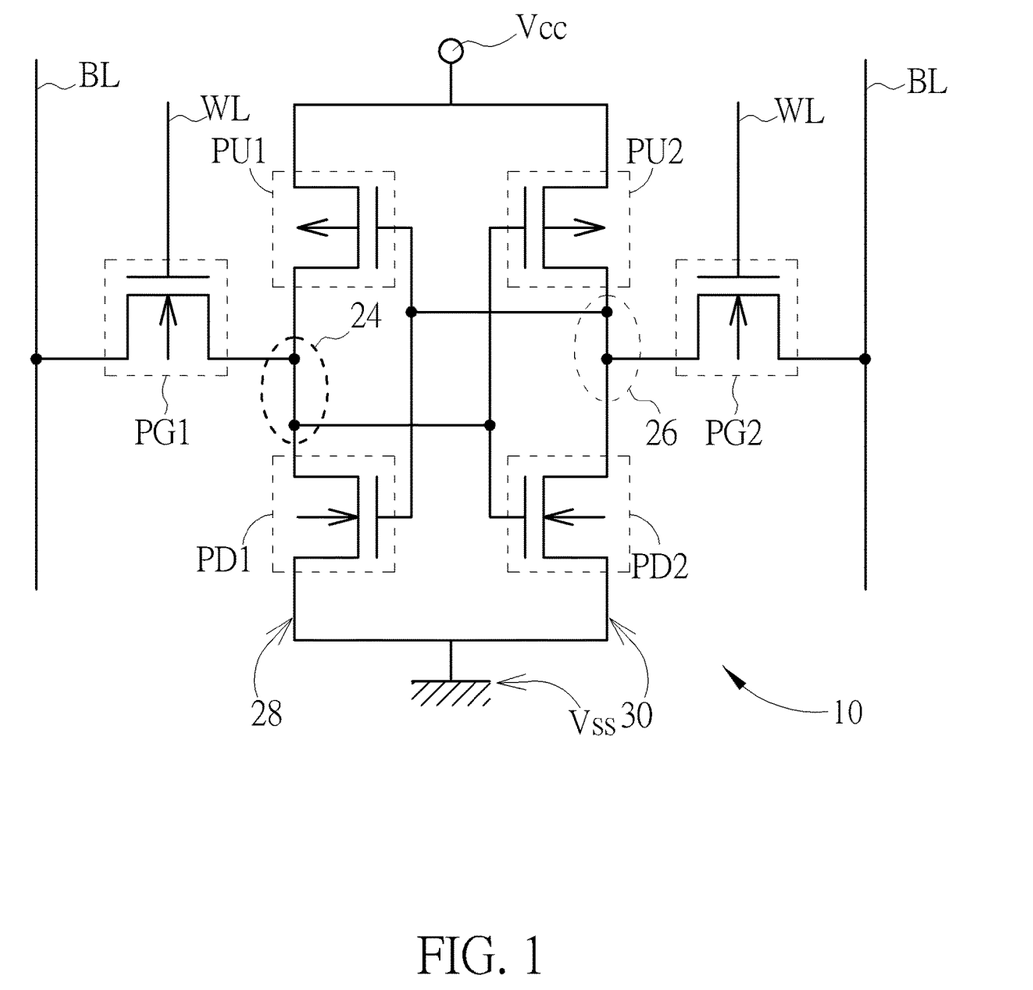
FIG. 1 illustrates a circuit diagram of a six-transistor SRAM (6T-SRAM) cell of a SRAM of the present invention.

Referring to FIG. 1, FIG. 1 illustrates a circuit diagram of a six-transistor SRAM (6T-SRAM) cell of a SRAM of the present invention. As shown in FIG. 1, the SRAM device of the present invention preferably includes at least one SRAM cell, each SRAM cell including a six-transistor SRAM (6T-SRAM) cell 10.

In this embodiment, each 6T-SRAM cell 10 is composed of a first pull-up transistor PU1, a second pull-up transistor PU2, a first pull-down transistor PD1, a second pull-down transistor PD2, a first pass gate transistor PG1 and a second pass gate transistor PG2. These six transistors constitute a set of flip-flops. The first and the second pull-up transistors PU1 and PU2, and the first and the second pull-down transistors PD1 and PD2 constitute a latch that stores data in the storage nodes 24 and 26. Since the first and the second pull-up transistors PU1 and PU2 act as power load devices, they can be replaced by resistors. Under this circumstance, the static random access memory becomes a four-transistor SRAM (4T-SRAM). In this embodiment, the first and the second pull-up transistors PU1 and PU2 preferably share a source/drain region and electrically connect to a voltage source Vcc, the first and the second pull-down transistors PD1 and PD2 share a source/drain region and electrically connect to a voltage source Vss.

Preferably, the first and the second pull-up transistors PU1 and PU2 of the 6T-SRAM cell 10 are composed of p-type metal oxide semiconductor (PMOS) transistors; the first and the second pull-down transistors PD1 and PD2, and first and the second pass gate transistors PG1 and PG2 are composed of n-type metal oxide semiconductor (NMOS) transistors. The first pull-up transistor PU1 and the first pull-down transistor PD1 constitute an inverter, which further form a series circuit 28. One end of the series circuit 28 is connected to a voltage source Vcc and the other end of the series circuit 28 is connected to a voltage source Vss. Similarly, the second pull-up transistor PU2 and the second pull-down transistor PD2 constitute another inverter and a series circuit 30. One end of the series circuit 30 is connected to the voltage source Vcc and the other end of the series circuit 30 is connected to the voltage source Vss.

The storage node 24 is connected to the respective gates of the second pull-down transistor PD2 and the second pull-up transistor PU2. The storage node 24 is also connected to the drains of the first pull-down transistor PD1, the first pull-up transistor PU1, and the first pass gate transistor PG1. Similarly, the storage node 26 is connected to the respective gates of the first pull-down transistor PD1 and first the pull-up transistor PU1. The storage node 26 is also connected to the drains of the second pull-down transistor PD2, the second pull-up transistor PU2, and the second access transistor PG2. The gates of the first and the second pass gate transistors PG1 and PG2 are respectively coupled to a word line (WL), and the sources are coupled to a relative data line (BL).

Figure 2:
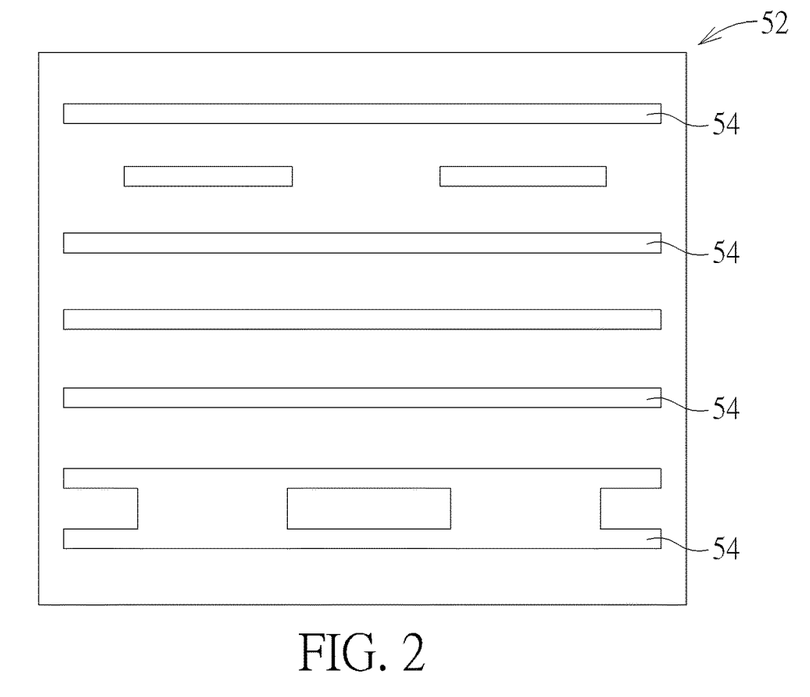
FIGS. 2-9 illustrate a method for fabricating a 6T-SRAM cell according to an embodiment of the present invention.

Referring to FIGS. 2-9, FIGS. 2-9 illustrate a method for fabricating a 6T-SRAM cell 10 according to an embodiment of the present invention. As shown in FIG. 2, a substrate 12 such as a silicon substrate or silicon-on-insulator (SOI) substrate is provided, and a plurality of fin-shaped structures are formed on the substrate 52. Preferably, the fin-shaped structures of this embodiment are preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers or mandrels 54 distributed with same spacing and of same width are formed on the substrate 52 as each of the mandrels 54 may be stripe-shaped.

Specifically, as shown in FIG. 2, it would be desirable to selectively form a hard mask (not shown) on the surface of the substrate 52, and then a plurality of mandrels 54 are formed on the hard mask. In this embodiment, the hard mask could be selected from the group consisting of silicon oxide, silicon nitride, silicon oxynitride (SiON), and silicon carbonitride (SiCN). Moreover, the formation of the mandrels 54 could be accomplished by first forming at least a material layer (not shown) on the surface of the hard mask and then conducting a pattern transfer process by using etching to remove part of the material layer for forming a plurality of patterned material layers serving as the mandrels 54. Preferably, the mandrels 54 could be selected from the group consisting amorphous silicon, polysilicon, silicon oxide, and silicon nitride, but not limited thereto. In this embodiment, each of the mandrels 54 could have different widths and the pitch between the mandrels 54 could be the same or different depending on the demand of the process.

Figure 3:
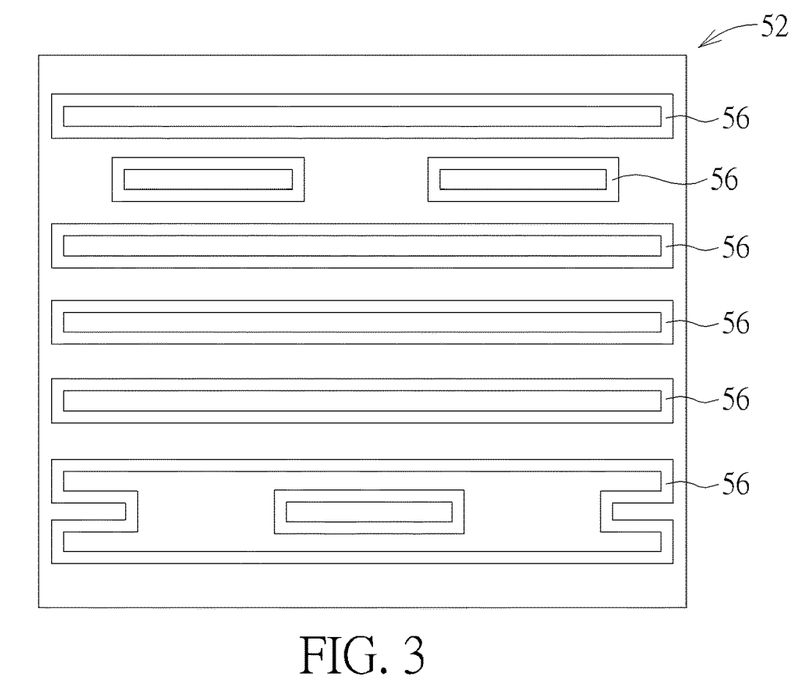

Next, as shown in FIG. 3, a cap layer (not shown) is formed on the surface of the mandrels 54, an etching back process is conducted to remove part of the cap layer for forming a spacer 56 adjacent to each of the mandrels 54, and then another etching process is conducted to remove the mandrels 54 so that only the spacers 56 are remained on the substrate 52. From a top view perspective, each of the spacers 56 includes a ring shape around the mandrels 54 and in this embodiment, the spacers 56 could be selected from the group consisting of silicon oxide, silicon nitride, silicon oxynitride (SiON), and silicon carbonitride (SiCN).

Figure 4:
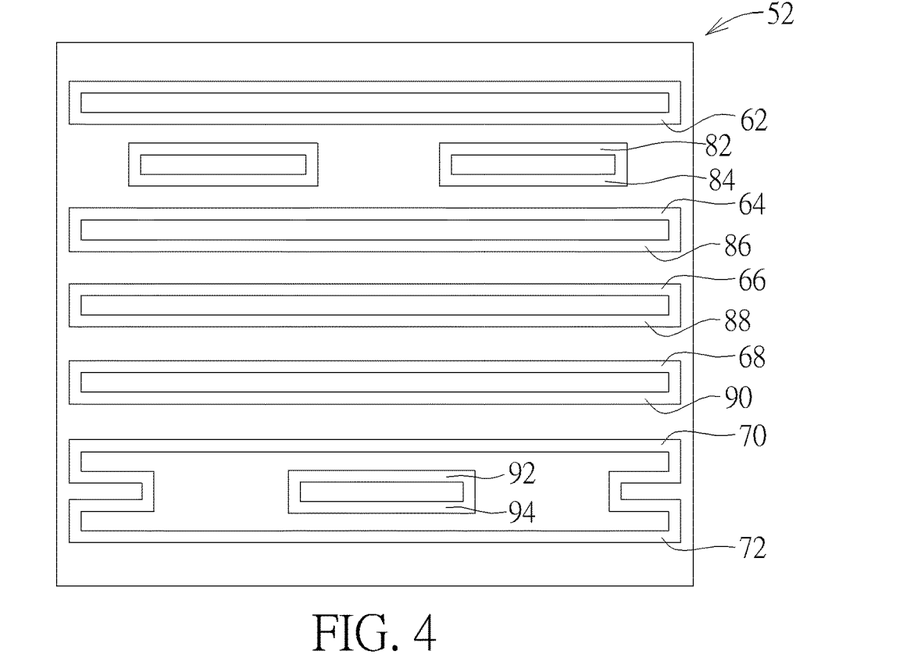

Next, as shown in FIG. 4, the pattern of the spacers 56 are transferred to the substrate 52 below, which could be accomplished by using the spacers 56 as a mask to remove part of the selective hard mask and part of the substrate 52 not covered by the spacers 56 through an etching process to form a plurality of fin-shaped structures, and the spacers 56 are removed thereafter. Since the pattern of the spacers 56 are transferred to the substrate 52 underneath to form fin-shaped structures, each of the fin-shaped structures if viewed from a top view perspective also includes a ring shape.

It should be noted that the ring-shaped fin-shaped structures formed by patterning through the spacers 56 preferably include six particular fin-shaped structures 62, 64, 66, 68, 70, 72 used for fabricating SRAM device in the later process as well as dummy fin-shaped structures 82, 84, 86, 88, 90, 92, 94. Preferably, the dummy fin-shaped structures 82, 84 are disposed between the fin-shaped structures 62, 64, the dummy fin-shaped structure 86 is disposed between the fin-shaped structures 64, 66, the dummy fin-shaped structure 88 is disposed between the fin-shaped structures 66, 68, the dummy fin-shaped structure 90 is disposed between the fin-shaped structures 68, 70, and the dummy fin-shaped structures 92, 94 are disposed between the fin-shaped structures 70, 72.

In this embodiment, the fin-shaped structure 62 is used for the first pass gate transistor PG1, the fin-shaped structure 64 is used for the second pass gate transistor PG2, the fin-shaped structure 66 is used for the first pull-up transistor PU1, the fin-shaped structure 68 is used for the second pull-up transistor PU2, the fin-shaped structure 70 is used for the first pull-down transistor PD1, and the fin-shaped structure 72 is used for the second pull-down transistor PD2.

Figure 5:
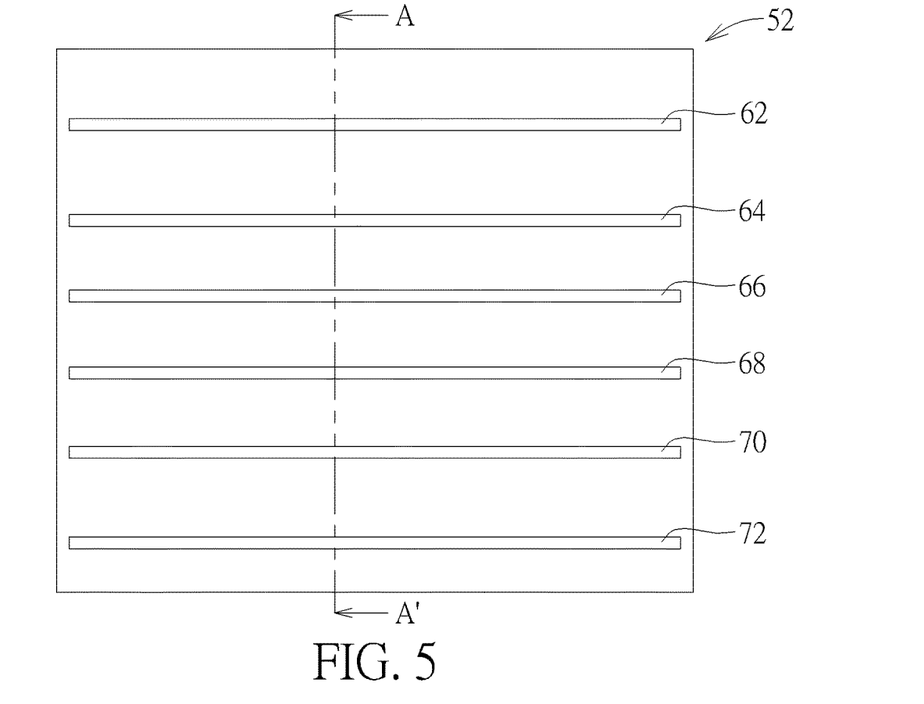

Next, as shown in FIG. 5, a fin remove process is conducted by using a photo-etching process to remove the dummy fin-shaped structures 82, 84, 86, 88, 90, 92, 94 and at the same time divided the ring shaped fin-shaped structures into separate and individual strip-shaped patterns. In other words, after using the fin remove process to remove the dummy fin-shaped structures 82, 84, 86, 88, 90, 92, 94, only sex fin-shaped structures 62, 64, 66, 68, 70, 72 used for the first pass gate transistor PG1, the second pass gate transistor PG2, the first pull-up transistor PU1, the second pull-up transistor PU2, the first pull-down transistor PD1, and the second pull-down transistor PD2 are remained on the substrate 52.

Figure 6:
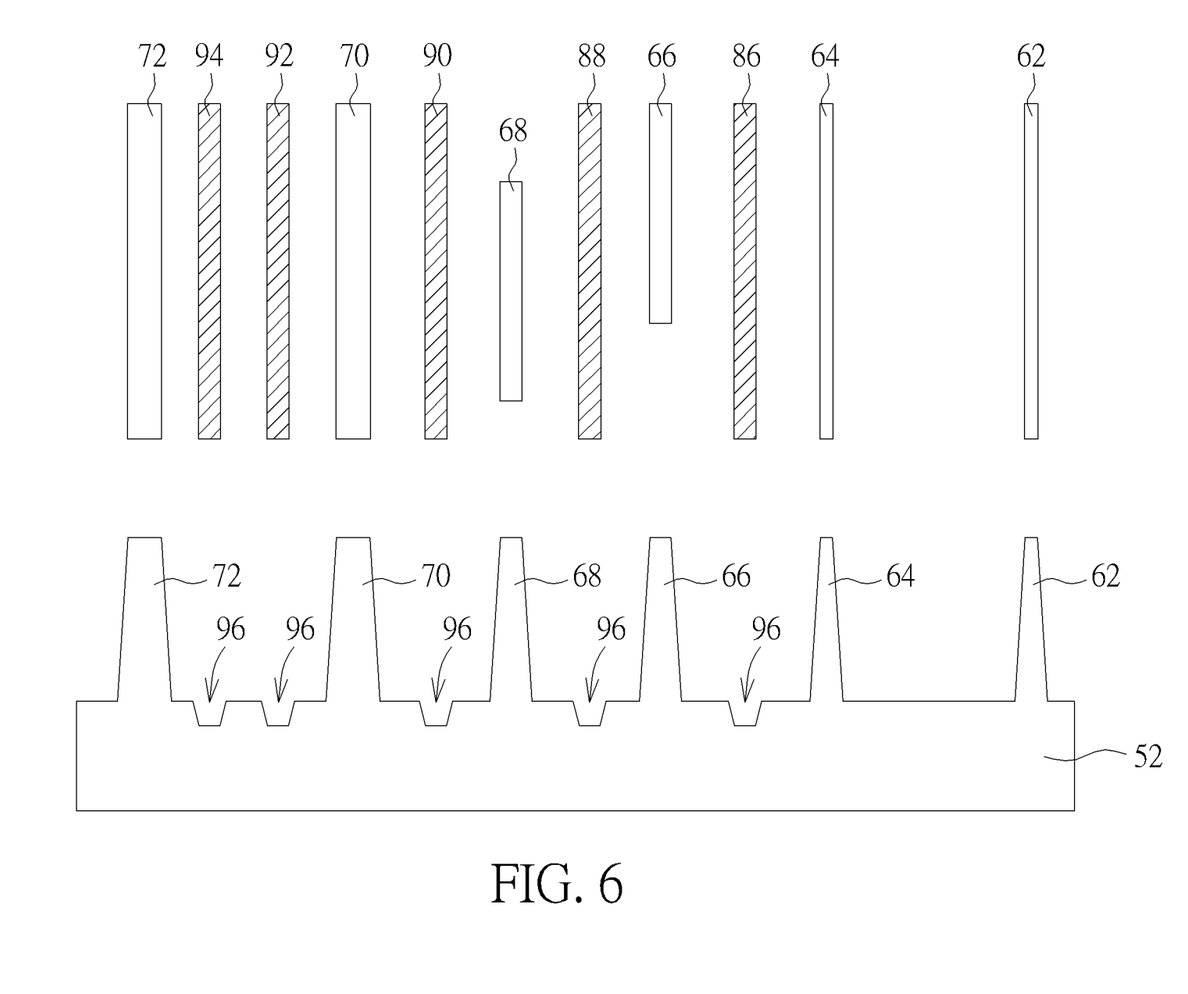

Referring to FIGS. 4-6, in which FIG. 6 illustrate a cross-section view of FIG. 5 taken along the sectional line AA'. As shown in FIGS. 4-6, as the fin remove process is conducted to remove the dummy fin-shaped structures 82, 84, 86, 88, 90, 92, 94, part of the substrate 52 is also removed at the same time to form recesses 96 between the fin-shaped structures 62, 64, 66, 68, 70, 72 at the original position of the dummy fin-shaped structures 82, 84, 86, 88, 90, 92, 94.

As shown from the top view perspective on top portion of FIG. 6 and cross-section perspective on bottom portion of FIG. 6, the fin-shaped structure 62 used for the first pass gate transistor PG1, the fin-shaped structure 64 used for the second pass gate transistor PG2, the fin-shaped structure 66 used for the first pull-up transistor PU1, the fin-shaped structure 68 used for the second pull-up transistor PU2, the fin-shaped structure 70 used for the first pull-down transistor PD1, and the fin-shaped structure 72 used for the second pull-down transistor PD2 are disposed from right to left on the substrate 52.

As shown on the bottom portion of FIG. 6, the fin-shaped structure 62 and the fin-shaped structure 64 preferably have same width, the fin-shaped structure 66 and the fin-shaped structure 68 have same width, and the fin-shaped structure 70 and the fin-shaped structure 72 have same width. Nevertheless, it should be noted that although not distinctively illustrated in the bottom portion of FIG. 6, since the region closer to the fin-shaped structures 62, 64 is defined as an iso region while the region closer to the fin-shaped structures 70, 72 is defined as a dense region, the width of each of the fin-shaped structures 62, 64 is preferably slightly less than the width of each of the fin-shaped structures 66, 68 and the width of each of the fin-shaped structures 66, 68 is also slightly less than the width of each of the fin-shaped structures 70, 72.

Moreover, no recess is formed between the fin-shaped structures 62, 64 or that the top surface of the substrate 62 between the two fin-shaped structures 62, 64 is completely planar without showing any sign of indentation, a recess 96 is disposed between the fin-shaped structures 64, 66, a recess 96 is disposed between the fin-shaped structures 66, 68, a recess 96 is disposed between the fin-shaped structures 68, 70, and two recesses 96 are disposed between the fin-shaped structures 70, 72. In other words, no recess is formed between the fin-shaped structures 62, 64 having minimum widths for the first pass gate transistor PG1 and the second pass gate transistor PG2, a single recess 96 is disposed between the fin-shapes structures 66, 68 having medium widths for the first pull-up transistor PU1 and the second pull-up transistor PU2, and two recesses 96 are disposed between the fin-shaped structures 70, 72 having maximum widths for the first pull-down transistor PD1 and the second pull-down transistor PD2.

Figure 7:
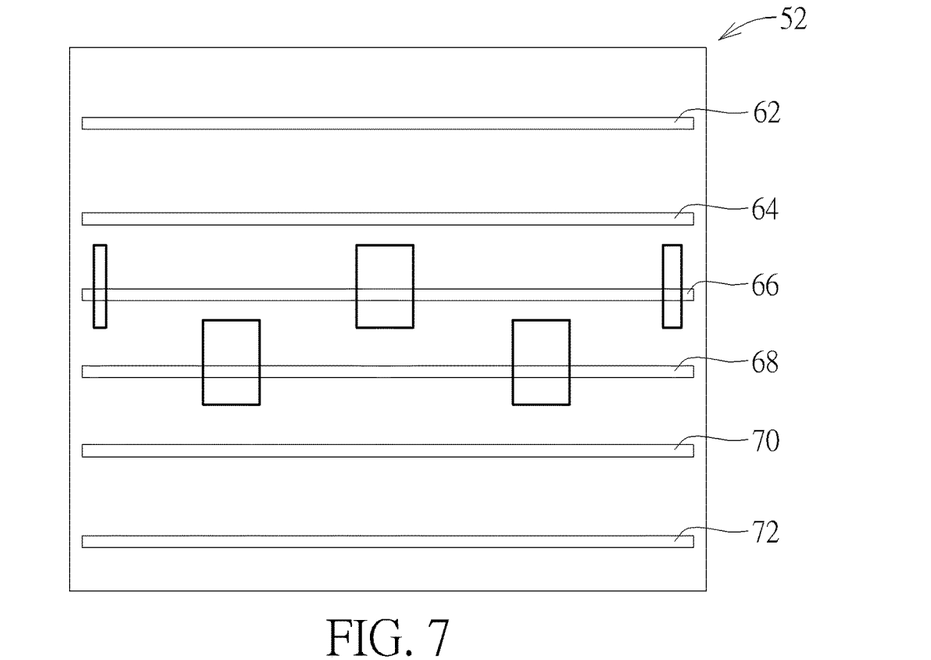

Next, as shown in FIG. 7, a fin cut process is conducted by using a patterned mask (not shown) to remove part of the fin-shaped structures 62, 64, 66, 68, 70, 72 through etching along the blocks according to desirable layout patterns so that the fin-shaped structures 62, 64, 66, 68, 70, 72 are further divided into additional stripe patterns.

Figure 8:
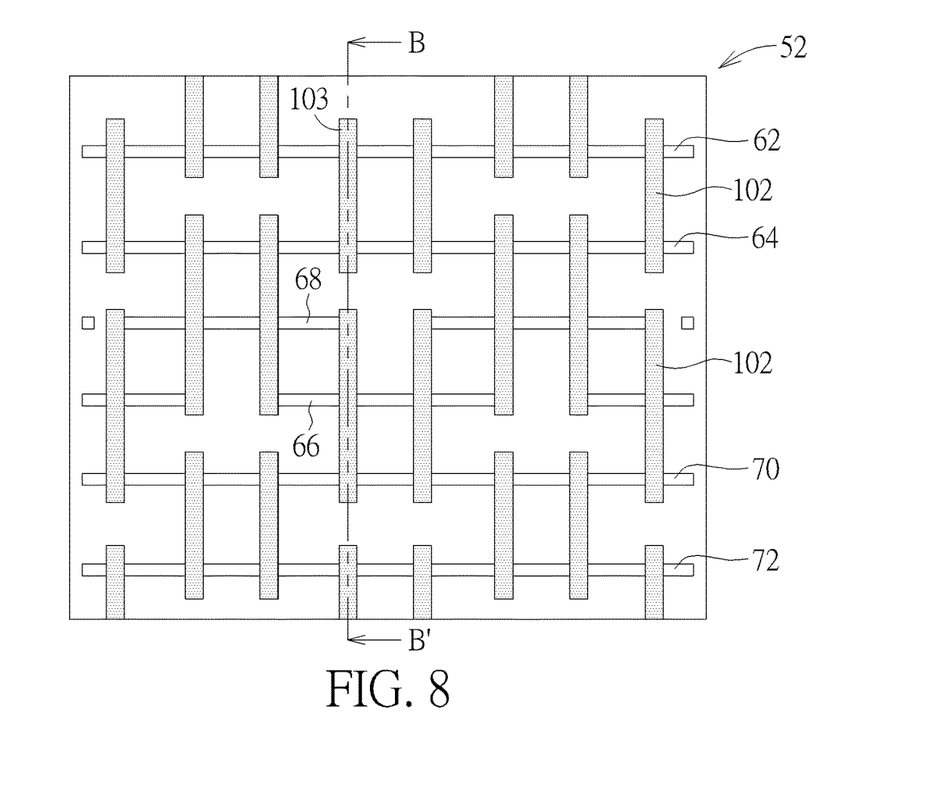
Figure 9:
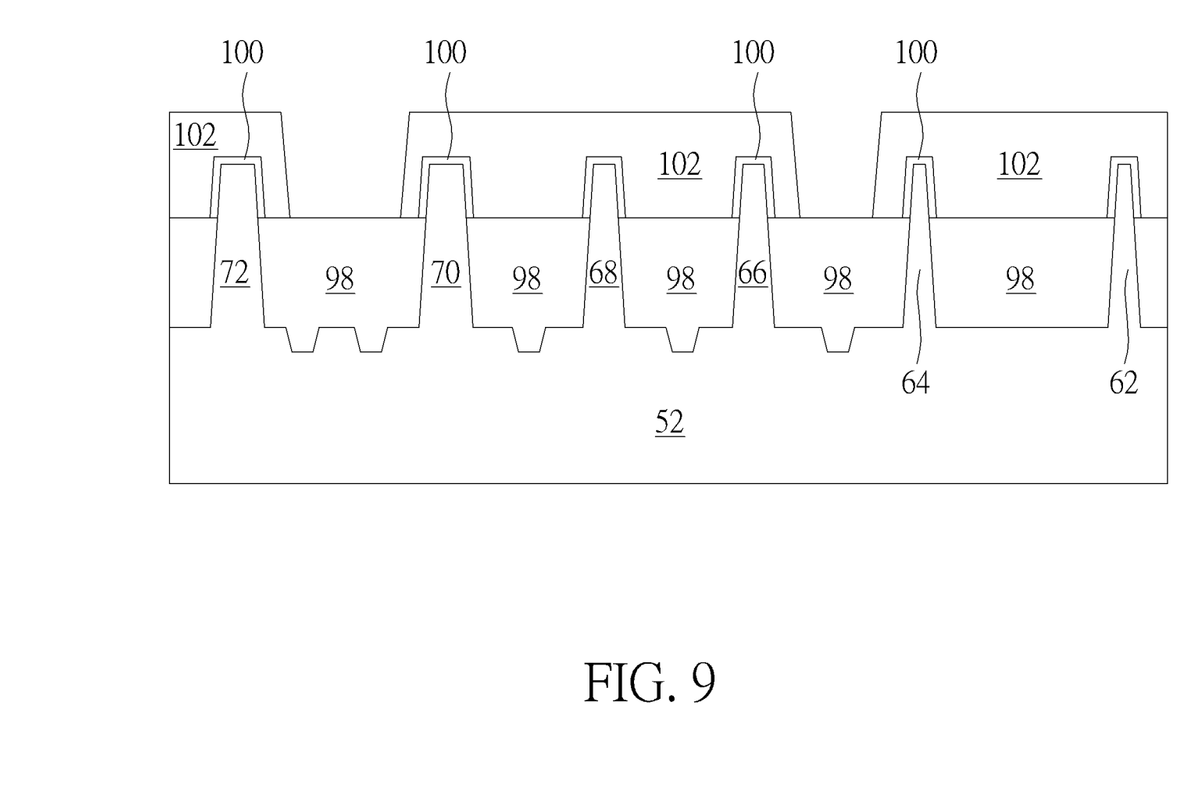

Referring to FIGS. 8-9, FIG. 8 illustrates a process for fabricating the SRAM device following FIG. 7 and FIG. 9 illustrates a cross-section view of FIG. 8 taken along the sectional line BB'. As shown in FIGS. 8-9, it would be desirable to form a shallow trench isolation (STI) 98 around the fin-shaped structures 62, 64, 66, 68, 70, 72, form a gate dielectric layer 100 on the fin-shaped structures 62, 64, 66, 68, 70, 72, form a gate structure 102 made of polysilicon on the gate dielectric layer 100 and on part of the fin-shaped structure 62, 64, 66, 68, 70, 72, and then form source/drain regions in the fin-shaped structures 62, 64, 66, 68, 70, 72 adjacent to two sides of the gate structure 102 depending on the demand of the process. Preferably, the gate structure 102 and the source/drain regions in the fin-shaped structures 62, 64, 66, 68, 70, 72 together constitute the first pass gate transistor PG1, the second pass gate transistor PG2, the first pull-up transistor PU1, the second pull-up transistor PU2, the first pull-down transistor PD1, and the second pull-down transistor PD2 of the SRAM device. This completes the fabrication of a SRAM device according to an embodiment of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a static random access memory (SRAM), comprising:
    forming a first fin-shaped structure for a first pull-down (PD) transistor on a substrate;
    forming a second fin-shaped structure for a second PD transistor on the substrate, wherein the first fin-shaped structure and the second fin-shaped structure comprise a first recess therebetween;
    forming a third fin-shaped structure for a first pass gate (PG) transistor on the substrate; and
    forming a fourth fin-shaped structure for a second PG transistor on the substrate, wherein the third fin-shaped structure and the fourth fin-shaped structure comprise no recess therebetween.

2. The method of claim 1, wherein the first fin-shaped structure and the second fin-shaped structure comprise a second recess therebetween.

3. The method of claim 2, further comprising:
    forming a fifth fin-shaped structure for a first pull-up (PU) transistor on the substrate; and
    forming a sixth fin-shaped structure for a second PU transistor on the substrate, wherein the fifth fin-shaped structure and the sixth fin-shaped structure comprise a third recess therebetween.

4. The method of claim 3, wherein the second fin-shaped structure and the fifth fin-shaped structure comprise a fourth recess therebetween.

5. The method of claim 4, wherein third fin-shaped structure and the sixth fin-shaped structure comprise a fifth recess therebetween.

6. The method of claim 5, further comprising:
    performing a sidewall image transfer (SIT) process to remove the substrate for forming the first fin-shaped structure, the second fin-shaped structure, and a first dummy fin-shaped structure and a second dummy fin-shaped structure between the first fin-shaped structure and the second fin-shaped structure.

7. The method of claim 6, further comprising:
    performing the SIT process to remove the substrate for forming the third fin-shaped structure, the fourth fin-shaped structure, the fifth fin-shaped structure, the sixth fin-shaped structure, a third dummy fin-shaped structure between the fifth fin-shaped structure and the sixth fin-shaped structure, a fourth dummy fin-shaped structure between the second fin-shaped structure and the fifth fin-shaped structure, and a fifth dummy fin-shaped structure between the third fin-shaped structure and the sixth fin-shaped structure.

8. The method of claim 7, further comprising:
    performing a removal process to remove the first dummy fin-shaped structure, the second dummy fin-shaped structure, the third dummy fin-shaped structure, the fourth dummy fin-shaped structure, and the fifth dummy fin-shaped structure for forming the first recess, the second recess, the third recess, the fourth recess, and the fifth recess.

9. The method of claim 1, wherein a width of the first fin-shaped structure is equal to a width of the second fin-shaped structure.

10. The method of claim 1, wherein a width of the third fin-shaped structure is less than the width of the first fin-shaped structure.

11. A static random access memory (SRAM), comprising:
    a first fin-shaped structure for a first pull-down (PD) transistor on a substrate;
    a second fin-shaped structure for a second PD transistor on the substrate, wherein the first fin-shaped structure and the second fin-shaped structure comprise a first recess therebetween;
    a third fin-shaped structure for a first pass gate (PG) transistor on the substrate; and
    a fourth fin-shaped structure for a second PG transistor on the substrate, wherein the third fin-shaped structure and the fourth fin-shaped structure comprise no recess therebetween.

12. The SRAM of claim 11, further comprising a second recess between the first fin-shaped structure and the second fin-shaped structure.

13. The SRAM of claim 12, further comprising:
    a fifth fin-shaped structure for a first pull-up (PU) transistor on the substrate; and a sixth fin-shaped structure for a second PU transistor on the substrate, wherein the fifth fin-shaped structure and the sixth fin-shaped structure comprise a third recess therebetween.

14. The SRAM of claim 13 further comprising a fourth recess between the second fin-shaped structure and the fifth fin-shaped structure.

15. The SRAM of claim 14, further comprising a fifth recess between the third fin-shaped structure and the sixth fin-shaped structure.

16. The SRAM of claim 11, wherein a width of the first fin-shaped structure is equal to a width of the second fin-shaped structure.

17. The SRAM of claim 11, wherein a width of the third fin-shaped structure is less than the width of the first fin-shaped structure.

\* \* \* \* \*